United States Patent
Lee

(10) Patent No.: US 7,358,558 B2
(45) Date of Patent: Apr. 15, 2008

(54) FLASH MEMORY DEVICE

(75) Inventor: Keun Woo Lee, Yongin-Si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/275,273

(22) Filed: Dec. 21, 2005

(65) Prior Publication Data

US 2007/0001211 A1    Jan. 4, 2007

(30) Foreign Application Priority Data

Jun. 30, 2005    (KR) ...................... 10-2005-0057841

(51) Int. Cl.
*H01L 29/76* (2006.01)
*H01L 21/336* (2006.01)

(52) U.S. Cl. ...................... 257/314; 257/315; 257/510; 257/E21.422; 257/E29.304; 438/257; 438/264; 438/430

(58) Field of Classification Search ................ 257/314, 257/315, E29.304, E21.422, 506, 510, 321; 438/257, 264, 424, 430
See application file for complete search history.

(56) References Cited

U.S. PATENT DOCUMENTS

| | | | | |
|---|---|---|---|---|
| 5,087,584 A | * | 2/1992 | Wada et al. ................ 438/262 |
| 6,069,382 A | | 5/2000 | Rahim | |
| 6,448,606 B1 | * | 9/2002 | Yu et al. ..................... 257/315 |
| 6,737,321 B2 | * | 5/2004 | Lee ............................ 438/264 |
| 6,964,913 B2 | * | 11/2005 | Dong et al. ................. 438/437 |
| 2003/0042530 A1 | | 3/2003 | Nakagawa | |
| 2003/0215999 A1 | | 11/2003 | Chern et al. | |
| 2006/0091445 A1 | * | 5/2006 | Utsuno ....................... 257/314 |

FOREIGN PATENT DOCUMENTS

TW    498503    8/2002

\* cited by examiner

*Primary Examiner*—T. N. Quach
(74) *Attorney, Agent, or Firm*—Marshall, Gerstein & Borun LLP

(57) ABSTRACT

A floating gate of a flash memory device is formed in a moat formed in an isolation film. Therefore, an electric field applied between a control gate and a channel region upon cycling can be precluded or mitigated. A distance between the control gate and the channel region is set greater than a predetermined value. Therefore, an electric field applied between the control gate and the channel region upon cycling can be mitigated. As a result, a data retention characteristic and an endurance characteristic can be improved.

6 Claims, 3 Drawing Sheets

WTSD>(THICKNESS OF DIELECTRIC FILM +
THICKNESS OF TUNNEL OXIDE FILM) x 2

FLASH MEMORY DEVICE

TECHNICAL FIELD

This patent relates to flash memory devices, and more particularly, to flash memory devices with an improved endurance characteristic and an improved data retention characteristic.

DISCUSSION OF RELATED ART

FIG. 1 is a cross-sectional view of a flash memory device for illustrating a manufacturing method of the device in the related art.

Referring to FIG. 1, a tunnel oxide film 102 and a first polysilicon layer 103 for forming a floating gate are sequentially formed on a semiconductor substrate 100. The first polysilicon layer 103 and the tunnel oxide film 102 are patterned by a Self-Aligned Shallow Trench Isolation (SA-STI) method. An isolation film 104 is then formed in an isolation region.

If the isolation film 104 is formed by the SA-STI method as described above, the tunnel oxide film 102 and the first polysilicon layer 103 remain on the active region between the projections of the isolation film 104 while the top of the isolation film 104 projects higher than the semiconductor substrate 100.

Thereafter, a second polysilicon layer 105 for forming the floating gate is formed on the entire surface. The second polysilicon layer 105 on the isolation film 104 is partially removed by an etch process. While the second polysilicon layer 105 is patterned vertically to a word line, the isolation film 104 is etched to a predetermined depth, thus forming a trench.

Thereby, a floating gate 106 consisting of the first and second polysilicon layers 103, 105 is formed.

Thereafter, an interlayer dielectric film 107 having an Oxide Nitride Oxide (ONO) structure and a polysilicon layer 108 for a control gate are formed on the entire surface. A tungsten silicide layer (not shown) for lowering sheet resistance is then formed on the polysilicon layer 108 for the control gate. The tungsten silicide layer, the polysilicon layer 108 for the control gate, the interlayer dielectric film 107 and the floating gate 106 are patterned by a photolithography process, thus forming a gate. A subsequent process is then performed to complete fabrication of the flash memory device.

As the level of integration of devices increases and the cell size shrinks, a word line of a flash memory device, i.e., a distance between a control gate and a semiconductor substrate below a floating gate, i.e., channel regions (Word line To Substrate Distance: WTSD) becomes short. For this reason, an endurance characteristic and a data retention characteristic (i.e., an Erase/Write (E/W) cycling characteristic) are significantly degraded.

FIG. 2 is a graph showing an endurance characteristic of the flash memory device in the related art. From FIG. 2, it can be seen that threshold voltages (Vt) of a programmed cell and an erased cell have an abnormal shift after 1K cycling. It means that cycling fail is generated.

FIG. 3 is a graph showing a breakdown voltage characteristic between a control gate and a channel region of the flash memory device in the related art. From FIG. 3, it can be seen that a breakdown voltage value (a control gate voltage value where Ig=1.0E−8) ranges from −15V to −29V and variation is very severe.

In a cell, a program bias upon cycling is generally 18 to 20V and an erase bias is 18 to 20V or −18 to −20V. If a thickness of the oxide film between the control gate and the channel region is shallow due to a short WTSD as in the related art, charges are trapped in the oxide film between the control gate and the channel region by means of a high bias voltage upon cycling. This results in a degraded data retention characteristic.

Furthermore, the larger the cycling number, the greater the amount of charges trapped in the oxide film between the control gate and the channel region. Therefore, since a threshold voltage is shifted or breakdown is generated, cycling fail occurs.

To fabricate a flash memory device, it is required that fail be not generated even after cycling of 100K or 1000K. In the related art, however, cycling fail is generated after 1K cycling. It is considered that this causes a serious problem in the endurance characteristic of the flash memory device.

SUMMARY OF THE INVENTION

A flash memory device may include a reduced amount of charges trapped in the oxide film between the control gate and the channel region upon cycling.

Such a flash memory device may improve a data retention characteristic and an endurance characteristic of flash memory device.

Such a flash memory device may further improve the reliability and yield of flash memory device.

A flash memory device may include a semiconductor substrate in which a field region and an active region are defined, a tunnel oxide film formed on the active region and the field region adjacent to the active region, an isolation film, which is formed in the semiconductor substrate of the field region as a shallow trench structure and has a moat of a predetermined depth at both sides of the tunnel oxide film, a floating gate, which is formed on the tunnel oxide film and the isolation film at both sides of the tunnel oxide film and fills the inside of the moat, a dielectric film formed along a surface step of the floating gate and the isolation film, and a control gate formed on the dielectric film.

Alternatively, a flash memory device may include a semiconductor substrate in which a field region and an active region are defined, a floating gate formed on the semiconductor substrate with a tunnel oxide film intervened therebetween, and a control gate formed on the semiconductor substrate including the floating gate with a dielectric film intervened therebetween. In this case, a minimal distance between the control gate and the active region is set to be greater than twice the sum of a thickness of the tunnel oxide film and a thickness of the dielectric film.

DETAILED DESCRIPTION OF PREFERRED EMBODIMENTS

Figure 1:
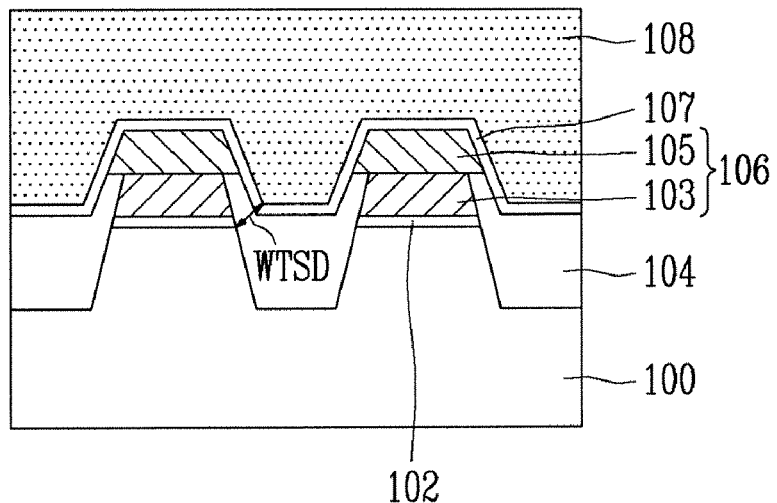
FIG. 1 is a cross-sectional view of a flash memory device for illustrating a manufacturing method of the device in the related art.
Figure 2:
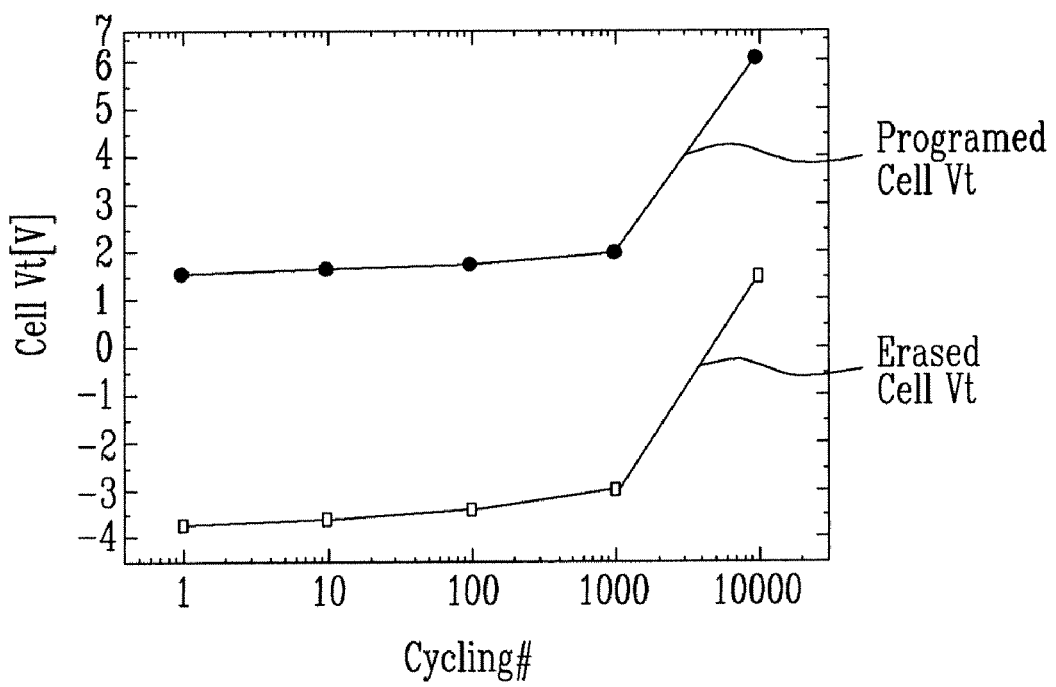
FIG. 2 is a graph showing an endurance characteristic of the flash memory device in the related art.
Figure 3:
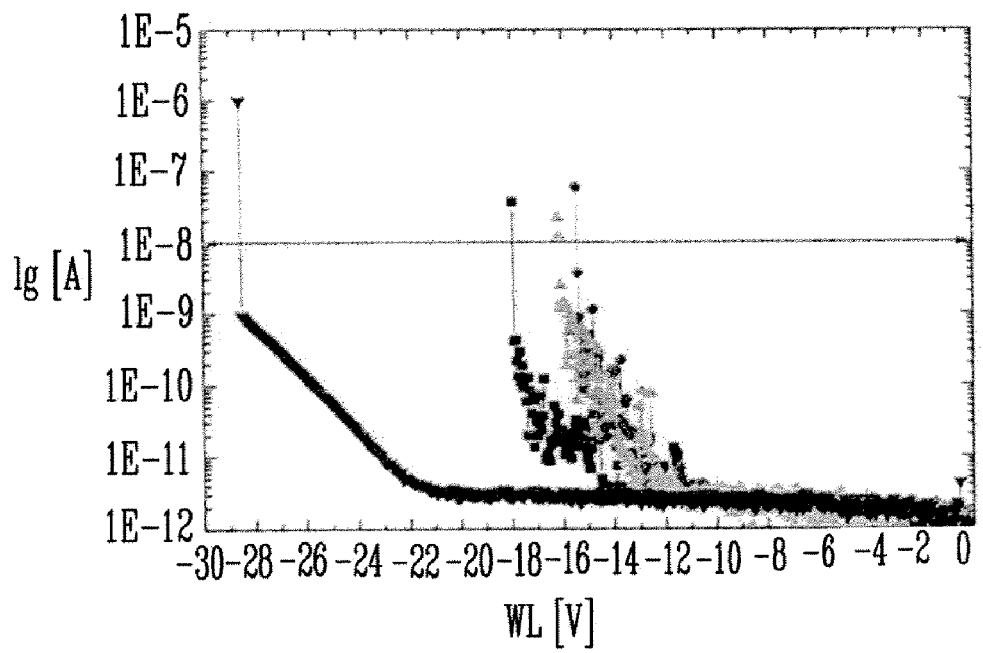
FIG. 3 is a graph showing a breakdown voltage characteristic between a control gate and a channel region of the flash memory device in the related art.
Figure 4:
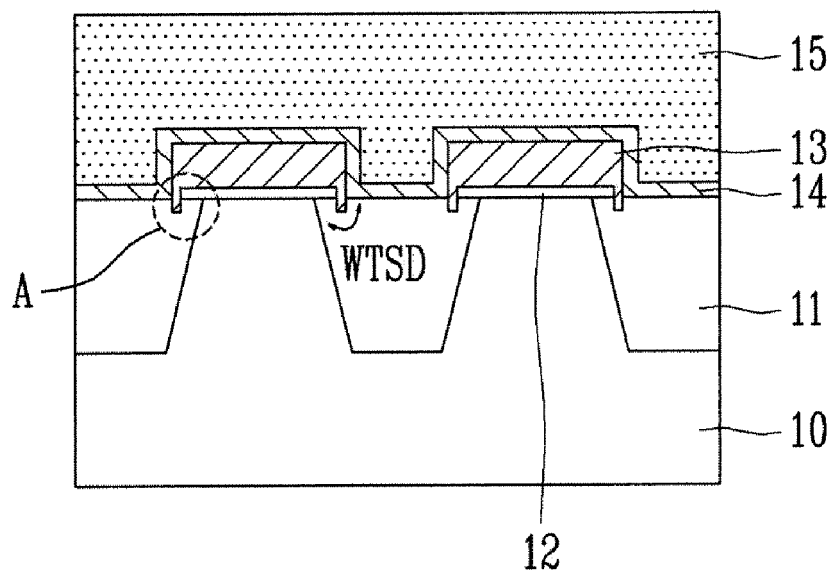
FIG. 4 is a cross-sectional view of a flash memory device according to a first described embodiment.

FIG. 4 is a cross-sectional view of a flash memory device according to a first described embodiment.

As shown in FIG. 4, an isolation film 11 may be formed in a predetermined region of a semiconductor substrate 10. The semiconductor substrate 10 is divided into a field region an active region. A tunnel oxide film 12 is formed on the active region and the isolation film 11 adjacent to the active region.

A moat having a predetermined depth is formed in the isolation film 11 below the tunnel oxide film 12. A floating gate 13 is formed on the tunnel oxide film 12 and the isolation film 11 at both sides of the tunnel oxide film 12 while filling the moat. The semiconductor substrate 10 of the active region below the tunnel oxide film 12 is a channel region.

The moat can be formed to a depth of the degree in which a bias applied to the control gate 15 will not have an influence on the channel region, i.e., 50 to 200 Å.

A dielectric film 14 is formed along the step where the floating gate 13 and the isolation film 11 are formed. A control gate 15 is formed on the dielectric film 14.

If the flash memory device is constructed as described above, an electric field applied between the control gate 15 and the channel region upon cycling is precluded or mitigated by the floating gate 13 formed in the moat. Therefore, the amount of charges trapped in the isolation film 11 between the control gate 15 and the channel region can be decreased. This leads to improved data retention characteristic and endurance characteristic.

The following Table 1 shows a minimal thickness of the oxide film between the control gate and the channel region, in which it can ensure the quality when an erase bias of 20V is applied to the control gate depending on the type of the oxide film.

|  | Standard Oxide Film | ONO film, Isolation Film |
|---|---|---|
| E-field [MV/cm] | 7.00 | 4.09 |
| Highest Bias [V] | 20 | 20 |
| Oxide Film Thickness = V/E [Å] | 286 | 408 |

From the above table, it can be seen that E-field, which ensures 20-year quality at a temperature of 150° C., of the standard oxide film generally used in the tunnel oxide film is about 7.00 MV/cm. This value is commonly used worldwide.

At this time, assuming that the highest bias voltage applied to the control gate upon cycling is 20V, the thickness of the oxide film should be at least 286 Å.

The oxide film used between the control gate and the channel region can include an ONO film (i.e., a dielectric film), a High Density Plasma (HDP) oxide film (i.e., an isolation film), a High Aspect Ratio Planarization (HARP) oxide film or the like. These oxide films have a low film quality in comparison with the standard oxide film and show a very low film quality when field stress is applied.

Therefore, the E-field, which can guarantee 20-year quality at a temperature of 150° C. in these oxide films, must be less than 4.9 MV/cm, which is lower than that of the standard oxide film. Assuming that the highest bias voltage applied to the control gate upon cycling is 20V, the thickness of the oxide film must be at least 408 Å.

The thickness of the oxide film between the control gate and the channel region may be varied depending on technology and flash device operating conditions. Even when misalignment is generated when fabricating the floating gate, shift is generated. The distance between the control gate and the channel region (WTSD) can be expressed in the following Equation in consideration of the above factors.

$$WTSD > (\text{thickness of dielectric film} + \text{thickness of tunnel oxide film}) \times 2$$

That is, the distance between the control gate and the channel region (WTSD) is set to be greater than twice the sum of the thickness of the ONO dielectric film and the thickness of the tunnel oxide film. In the case of 60 to 90 nm NAND flash memory, the distance between the control gate and the channel region (WTSD) can be set to be greater than 420 Å.

As described above, if the distance between the control gate and the channel region (WTSD) is set to be greater than a predetermined value, an electric filed applied between the control gate and the channel region can be mitigated. Therefore, the amount of charges trapped in the isolation film between the control gate and the channel region can be reduced.

As a result, a data retention characteristic and an endurance characteristic can be improved.

Figure 5:
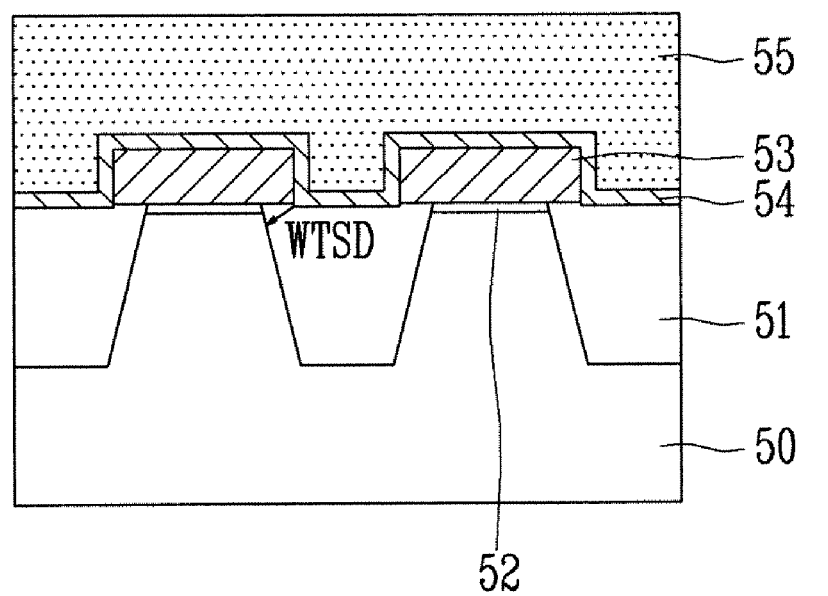
FIG. 5 is a cross-sectional view of a flash memory device according to a second described embodiment.

FIG. 5 is a cross-sectional view of a flash memory device according to a second described embodiment. FIG. 5 shows a conventional Shallow Trench Isolation (STI) structure.

Referring to FIG. 5, an isolation film 51 is formed in a semiconductor substrate 50 to define a field region and an active region. A tunnel oxide film 52 is formed on the semiconductor substrate 50 of the active region. The semiconductor substrate 50 of the active region below the tunnel oxide film 52 is a channel region.

A floating gate 53 is formed on the tunnel oxide film 52 and the isolation film 51 adjacent to the tunnel oxide film 52. A width of the floating gate 53 is appropriately controlled so that the distance between the channel region and the control gate (WTSD) satisfies the conditions of the above Equation.

Furthermore, an ONO dielectric film 54 and a control gate 55 are formed along the surface step of the floating gate 53 and the isolation film 51.

While embodiment of FIG. 5 shows a conventional STI structure, a SA-STI structure, a self-aligned floating gate structure and the like may be used.

The described embodiments demonstrate a number of advantages.

Firstly, the floating gate is formed in the moat formed in the isolation film so that an electric field applied between the control gate and the channel region upon cycling can be precluded or mitigated by the floating gate. Therefore, the amount of charges trapped in the oxide film between the control gate and the channel region can be reduced.

Secondly, a distance between the control gate and the channel region is set to be greater than a predetermined value, so that an electric field applied between the control gate and the channel region upon cycling can be mitigated. Therefore, the amount of charges trapped in the oxide film between the control gate and the channel region can be reduced.

Thirdly, since the amount of charges trapped in the oxide film between the control gate and the channel region can be reduced, a data retention characteristic and an endurance characteristic can be improved.

Although the foregoing description has been made with reference to the various embodiments, it is to be understood that changes and modifications may be made by the person of ordinary skill in the art without departing from the spirit and scope of the present invention defined by the appended claims.

What is claimed is:

1. A flash memory device, comprising:
   a semiconductor substrate in which a field region and an active region are defined;
   a tunnel oxide film formed on the active region and the field region adjacent to the active region;
   an isolation film, which is formed in the semiconductor substrate of the field region as a shallow trench structure and has a moat of a predetermined depth at both sides of the tunnel oxide film;
   a floating gate, which is formed on the tunnel oxide film and the isolation film at both sides of the tunnel oxide film and fills the inside of the moat;
   a dielectric film formed along a surface step of the floating gate and the isolation film; and
   a control gate formed on the dielectric film.

2. The flash memory device as claimed in claim 1, wherein the depth of the moat is set to 50 to 200 Å.

3. A method of manufacturing a flash memory device, comprising the steps of:
   forming a tunnel oxide film in an active region on a semiconductor substrate defined by an isolation film;
   forming a shallow trench on the isolation film at both sides of the tunnel oxide film;
   forming a floating gate on the active region while filling the inside of the shallow trench; and
   forming a dielectric film and a control gate along a step of the formed floating gate.

4. The method as claimed in claim 3, wherein a depth of the trench is set to 50 to 200 Å.

5. The method as claimed in claim 3, wherein a minimal distance between the control gate and the active region is set to be greater than twice the sum of a thickness of the tunnel oxide film and a thickness of the dielectric film.

6. The method as claimed in claim 5, wherein the minimal distance between the control gate and the active region is set to 480 Å.

* * * * *